INVENTOR
Solomon L. Miller

BY Sughrue, Rothwell, Mion & Zinn
ATTORNEYS

INVENTOR
Solomon L. Miller

BY Sughrue, Rothwell, Mion & Zinn
ATTORNEYS

United States Patent Office 3,036,226 Patented May 22, 1962

3,036,226

NEGATIVE RESISTANCE SEMICONDUCTOR CIRCUIT UTILIZING FOUR-LAYER TRANSISTOR

Solomon L. Miller, Poughkeepsie, N.Y., assignor to International Business Machines Corporation, New York, N.Y., a corporation of New York Filed May 1, 1959, Ser. No. 810,371
8 Claims. (Cl. 307—88.5)

This invention relates to negative resistance electrical circuits which employ two semi-conductor devices, which circuits exhibit the so-called hook characteristic. The invention operates in accordance with similar principles disclosed in the copending U.S. application, Serial No. 780,300, filed by Richard Rutz, on December 15, 1958, and assigned to the assignee of the instant application.

In the conventional hook collector semi-conductors in the prior art of the type described in "PNPN Transistor Switches" by J. L. Moll et al., Proc. IRE. vol. 44, September, 1956, the voltage at which the critical junction of the semi-conductor breaks down to provide a rapidly increasing current through the transistor is well-defined. However, not so well defined is the current through the transistor at which the negative resistance characteristic is evidenced. Consequently, in the conventional type of hook transistor in the prior art there is little control over the point at which the voltage switches from the critical breakdown voltage across the transistor to a minimum voltage thereacross. Also, the current in this switching region is an irregular function of the voltage. Further, capacitive currents and variations in alpha of different portions of the prior art devices contribute to a response behavior which is different for different switching rates.

In the above-mentioned U.S. application Serial No. 780,300 is disclosed a single unit multiple junction semi-conductor device functioning as a diode in which hook action is achieved by the avalanche voltage breakdown of at least two of said junctions so that the critical voltage at which the first junction breaks down defines the initiation of high current, and the flow of high current in turn flowing through the selected internal resistance in one zone produces a voltage drop which causes the breakdown of a second junction and initiates hook action, which thus manifests the negative resistance characteristic of the device. By the term "hook action" is meant that the total amplification factor of the device becomes greater than or equal to unity. In this device the breakdown voltage of the second junction is lower than the breakdown voltage of the first junction, and there is an appreciable resistance built into the device. The term "avalanche" is employed to include both avalanche or Zener mechanisms currently used in the art and any voltage sensitive similar breakdown mechanism.

It is therefore an object of this invention to provide negative resistance electrical circuits employing semi-conductor devices in which the breakdown voltages of two junctions are well defined whereupon the current flowing through the electrical circuit rapidly increases.

It is another object of this invention to provide negative resistance electrical circuits in which the value of current flowing through the circuit during the manifestation of negative resistance is well defined.

Another object is to provide a controllable negative resistance characteristic for a four-zone transistor.

In accordance with one embodiment of the invention there is an electrical circuit functioning as a diode with a negative resistance characteristic which consists of two semi-conductor devices, each having a junction with a critical reverse breakdown voltage and connected together by external impedance means across which a potential drop appears occasioned by increased current flow due to the reverse breakdown of one junction and which thereafter causes the reverse breakdown of the second junction.

In accordance with another embodiment of the invention, there is an electrical circuit functioning as a diode with a negative resistance characteristic which consists of two semi-conductor devices, one having a junction with a critical reverse breakdown voltage and the other having a junction with a constant voltage characteristic in its forward direction, and connected together by external impedance means across which a potential drop appears occasioned by increased current flow due to the reverse breakdown of one junction and which thereafter causes the other junction to conduct heavily in its forward direction.

In the accompanying drawings FIGURES 1 to 4, inclusive, are taken from the previously identified copending application.

Figure 1:
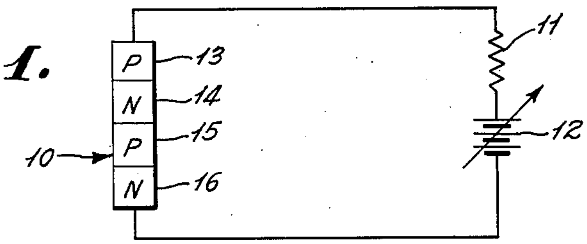
FIGURE 1 is a diagrammatic representation of a circuit including a conventional PNPN diode.
Figure 2:
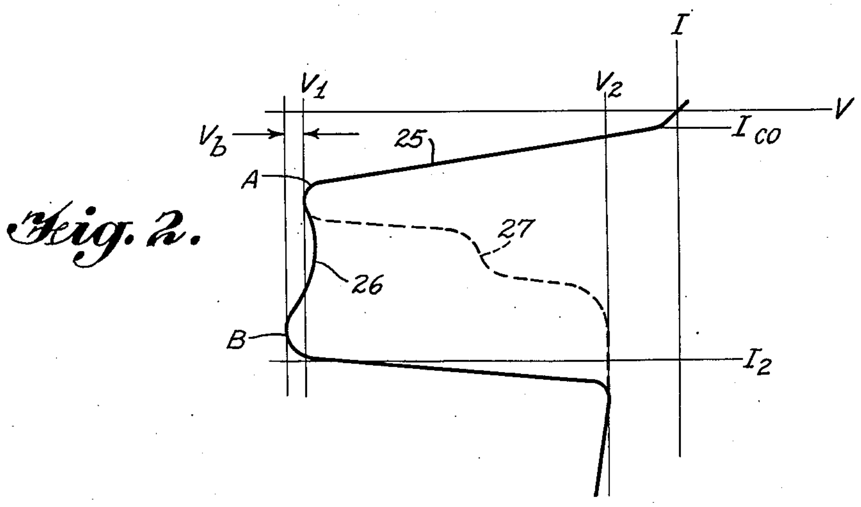
FIGURE 2 is a graphical illustration of voltage versus current under the conditions of operation of a negative resistance structure illustrating both the present invention and the prior art.
Figure 3:
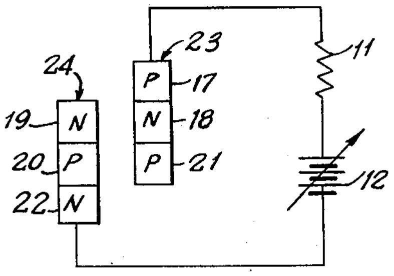
FIGURE 3 is an analytic illustration conventionally used to explain the functioning of a device such as FIGURE 1.

Referring first to FIGURES 1 to 3, inclusive, the diode 10 is a PNPN diode constructed in accordance with the prior art. It is connected in series with a resistor 11 to the plus side of a variable voltage source 12. The negative side of the source 12 is connected to the outermost N-region of the diode 10 and both are jointly connected to ground. Referring to FIGURE 3, there is shown a diagrammatic illustration of the functioning of the diode of FIGURE 1. Actually, the diode of FIGURE 1 acts in the circuit in a manner similar to the PNP and NPN transistors arranged in the manner shown in FIGURE 3. The P-region 13 of diode 10 is the same as the P-region 17 of transistor 23; the N-region 14 is the same as the N-regions 18 and 19 of transistors 23 and 24; the P-region 15 is the same as the P-regions 20 and 21 of the transistors 23 and 24, and the N-region 16 is the same as the N-region 22 of transistor 24. The load resistor 11 is common in both of these diagrams, as is the variable voltage source 12. Upon the application of a relatively small voltage to the transistors 23 and 24, the PN diode of transistor 23 is forward biased. However, the NP diodes 18 and 21 of transistor 23 and the NP diodes 19 and 20 of transistor 24 are reverse biased. Consequently, the only current flowing therethrough is essentially the $I_{co}$ of these diodes which is the reverse leakage current therethrough of an extremely small value. As the voltage applied across the transistors increases this saturation current increases somewhat until finally both junctions defined between the NP diodes of transistors 23 and 24 break down. At this time an increased amount of current is permitted to flow therethrough and the transistors in effect offer a greatly decreased impedance to current flow. When this happens the transistors combine to provide a negative resistance characteristic by virtue of the fact that the large current flow is accompanied by a decrease of voltage drop thereacross. The point at which the breakdown occurs is a function of the voltage applied across the transistor which reaches a critical value when the two NP diodes in the transistors 23 and 24 break down. The current rapidly increases to a stable value accompanied by a reduction in voltage across these two transistors. The current value at which this negative resistance characteristic is initiated is not well defined and also current in this critical region is an irregular function of the voltages.

The operation of these two transistors 23 and 24 exemplifying the operation of a typical negative resistance device such as the diode 10 of FIGURE 1 is shown graphically by dotted line in FIGURE 2. As can be seen, as the voltage increases across the transistor there is initially a very small increase in the current flow therethrough as represented by the portion of the curve labeled 25. However, when $V_1$ is reached, the current has reached a value which will cause breakdown of the critical junction in the diode 10. At a certain current, defined by the fact that the sum of the low voltage alpha of the individual portions of the device exceeds unity, the hook action is initiated. The voltage across the diode 10 collapses with an increase of current therethrough denoted by the portion of the curve labeled 27, thus manifesting the negative resistance characteristic.

The negative resistance circuit constructed in accordance with this invention, however, will function as illustrated by the solid lined curve including indicative portions labeled 25 and 26 which describes the effect. The initial portion of the solid curve is substantially identical to the initial portion of the dotted curve. Here it can be seen that the current values at which the hook action B, as well as the avalanche action A, are initiated are well defined. The current at the hook action B is identified as $I_2$. Also the current flow through the negative resistance circuit constructed in accordance with this invention during the collapse of voltage from $V_1$ and $V_2$ across the circuit is a more linear function of this voltage than is indicated by the portion 27 of the dotted curve.

Figure 4:
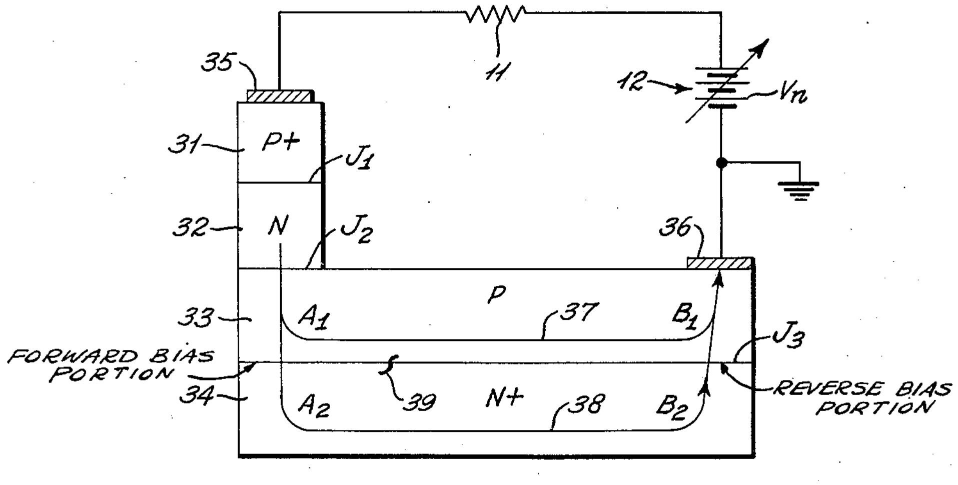
FIGURE 4 is a diagrammatic illustration of a negative resistance device constructed in accordance with the invention of the aforementioned U.S. application Serial No. 780,300, and employed in a circuit which will exemplify its functioning.

For the purpose of merely outlining the basic principle of two-junction breakdown which is employed in the present invention, FIGURE 4 is now referred to which shows an embodiment of the invention disclosed in the aforementioned U.S. application Serial No. 780,300. The negative resistance device is four-region PNPN semiconductor structure, and in this illustration the two terminal ohmic connections 35 and 36 are now made to P-regions 21 and 33, respectively, while the N-regions 32 and 34 are left floating. As may be apparent to one skilled in the art, connections to the floating regions may be made for signal introduction purposes. P-regions 31 and N-regions 34 are more heavily doped with their respective impurities than are the two innermost N and P-regions 32 and 33, respectively. A region heavily doped provides less resistance to current passing therethrough than does a region lightly doped.

If a positive potential is applied to the top P-region 31 as shown in FIGURE 4, then the three PN junctions labeled $J_1$ and $J_2$ and $J_3$ will be biased as indicated. Junction $J_1$ is biased in a forward direction since a more positive voltage is applied to the P-region 31 than is applied to the N-region 32. Conversely, junction $J_2$ is reversed biased, since N-region 32 is at a more positive potential than is P-region 33. Junction $J_3$, however, will be both forward and reversed biased in different places as shown. This is due to the fact the potential drop from point $A_1$ to point $B_1$ in P-region 33 due to the current flowing in path 37 will be greater than the potential drop between points $A_2$ and $B_2$ in the N-region 4 due to the current flowing in path 38. This is because the P-region 33 is more lightly doped than is the N-region 4, and thus provides more resistance to the flow of current. This difference in resistance can be further insured by making the N+ region 34 thin and covering it with a good conductor such as a solder coating not shown. This potential drop, then, between points $A_1$ and $B_1$ in the P-region 33 is of such a magnitude so as to cause the right-hand section of P-region 33 to be at a lower potential than is the right-hand section of N-region 34, thus creating a reverse bias at this section of the $J_3$ junction. Since the N+ region is of very low resistance, it may be considered to be equipotential throughout and point 39 is a point along the junction $J_3$ and the region 33 where the potential is equal to the potential of region 34. The device is further doped such that the reverse breakdown voltage for junction $J_2$ will be much greater than the reverse breakdown voltage for the right-hand section of junction $J_3$.

For applied voltages $V_n$ across the semi-conductor device which are less than the breakdown voltage for the junction $J_2$, only small reverse currents will flow across this junction and through parallel paths 37 and 38 to the base ohmic connection 36. The current through the essentially equipotential N-region 34 will be quite limited by the low reverse leakage current coming through the reversed bias section of junction $J_3$. Point A on the curve 25 shown in FIGURE 2 will be reached when the applied voltage $V_n$ equals the breakdown voltage for junction $J_2$, which corresponds to $V_1$ on the curve. Thus junction $J_2$, whose resistance has been decreased due to the avalanche breakdown phenomenon occurring at voltage $V_1$, will permit a higher current to flow into the bottom two P—N regions. This current is represented by the line 26 in FIGURE 2. The greater portion of this higher current will flow in path 37 of P-region 33 and will increase the potential drop between P-region 33 and N-region 34 at the right-hand section of junction $J_3$. When the drop across the right-hand section of junction $J_3$ reaches the breakdown voltage of $J_3$, then a large current begins to flow in path 38 through the N-region 34. The breakdown of junction $J_3$ is considered to occur at point B shown in the curve in FIGURE 2. Thus, at point B of FIGURE 2 there are now two large currents flowing in paths 37 and 38 of FIGURE 4. The sum of these two currents must equal the current flowing across junction $J_2$. It is therefore seen that the effective resistance of the parallel paths 37 and 38 is reduced when the voltage breakdown at the right-hand section of $J_3$ is reached.

The variation in curvature at point A in the curve is due to the fact that the avalanche process can be sustained at a slightly lower voltage due to an increase in injection of holes from the P+ region 31 as current increases. This process, in general, is the beginning of a negative resistance such as curve 27 of the prior art, however, in the device shown in FIGURE 4 the built-in positive resistance in region 33 over-rides the negative resistance and provides a positive slope 26 to the portion of the curve between points A and B. In cases where the injection of junction $J_1$ is constant the voltage indicated as $V_b$ will equal $V_2$ and the slope of the portion 26 of the curve will be a measure of the effective resistance of zone 33.

The large current coming out of the forward biased region of junction $J_3$ will be minority carriers so that it acts as the emitter to the hook collector formed by P-region 31 and N-region 32. This large current, which is indicated at point B of FIGURE 2, now causes the voltage across the entire unit to collapse to voltage $V_2$ due to typical hook collector transistor action. A negative resistance characteristic is thus exhibited by the device. Since the only function of the P-region 31 and N-region 32 is to provide a PN hook collector, it is seen that this top junction $J_1$ may be replaced by any electrode with an inherent amplifying and multiplying action.

In summing up the above operation, it is seen that at point A of the curve shown in FIGURE 2 the breakdown voltage $V_1$ of junction $J_2$ is reached, thus causing more current to flow in path 37 of P-region 33 than was formerly flowing before voltage $V_1$ was reached. This increased current in path 37 causes the reverse bias on the right-hand section of junction $J_3$ to become greater until the breakdown voltage of junction $J_3$ is attained, at which time point B has been reached on the curve of FIGURE 2. Upon the breaking down of the junction $J_3$ a large current can now begin to flow in path 38 as well as in path 37, thus creating a much larger current flow through the entire device and especially through junctions $J_2$ and $J_1$. The typical hook action of the top PN hook collector now occurs wherein, since region 34 is established by the broken down portion of $J_3$ at essentially reference potential, any increase in flow through path 37 serves to increase the forward bias on the forward biased portion of $J_3$ and therefore increases the injection of minority carriers each of which liberates $\propto$ majority carriers where $\propto$ is the amplification of the hook. The entire voltage across the device thus reverts to voltage $V_2$ as is shown in FIGURE 2.

It is seen, therefore that the voltage breakdown of both junctions $J_2$ and $J_3$ is required before the PNPN diode of FIGURE 4 exhibits a negative resistance characteristic due to the action of its PN hook collector. The critical breakdown voltage junction $J_2$ is essentially applied by voltage $V_n$, which is of large magnitude. However, the voltage drop across the right-hand section of junction $J_3$ is created only by the current flowing in parallel paths 37 and 38. The magnitude of this voltage drop is therefore somewhat limited, and so the critical breakdown voltage across junction $J_3$ at this point must be low as compared to that for junction $J_2$. Furthermore, the P-region 33 must be doped in such a manner so as to provide a lateral impedance path therethrough which is much greater than the impedance of a path through N-region 34. The process of fabricating such a single unit semi-conductor device must therefore be closely controlled so that the above-described criteria can be obtained.

Figures 5, 6:
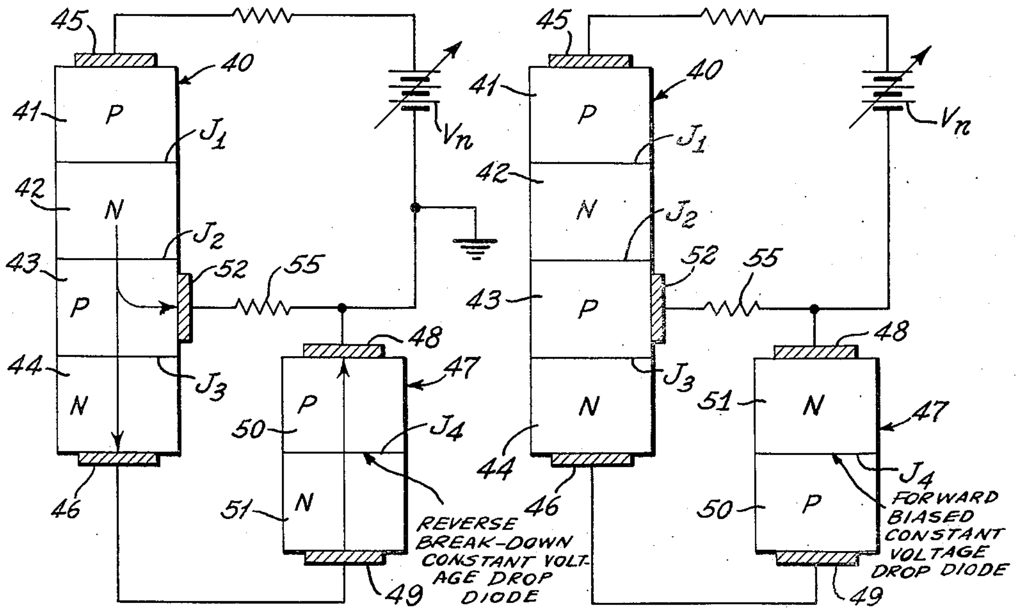
FIGURE 5 is a diagrammatic illustration of one embodiment of a negative resistance electrical circuit constructed in accordance with the present invention.
FIGURE 6 is a diagrammatic illustration of another embodiment of a negative resistance circuit constructed in accordance with the present invention.

In accordance with the present invention, an electrical circuit exhibiting negative resistance is constructed in which two ordinary semi-conductor devices are employed, each having one of the two breakdown junctions necessary for the operation according to the basic principles of the invention disclosed in the aforementioned application. FIGURE 5 shows one embodiment of the electrical circuit of the present invention. There is shown a multiple junction single crystal PNPN diode 40 which is connected in circuit with a single junction Zener diode 47. The positive side of a variable voltage $V_n$ is connected to a base ohmic contact 45 at the P-region 41. Two ohmic contacts 46 and 49 and lead 56 connect together the N-regions 44 and 51 of diodes 40 and 47, respectively. The impedance 55 is connected between two ohmic contacts 52 and 48 which are attached to P-regions 43 and 50 of diodes 40 and 47, respectively. The negative side of voltage $V_n$ is connected to ohmic contact 48 which is attached to P-region 50 of diode 47.

P and N-regions 41 and 42 of diode 40 correspond to P and N-regions 31 and 32, respectively, of the diode shown in FIGURE 4. N-regions 44 and 51 of diodes 40 and 47, respectively, also correspond to the N-region 34 of the diode in FIGURE 4, since they are essentially at equipotential. P-regions 43 and 50 of diodes 40 and 47, respectively, correspond to the left- and right-hand portions, respectively, of P-region 33 in FIGURE 4. Junctions $J_1$ and $J_2$ of diode 40 also correspond to junctions $J_1$ and $J_2$ in FIGURE 4. Junction $J_3$ of diode 40 corresponds to the forward biased left-hand portion of junction $J_3$ in FIGURE 4, while junction $J_4$ of diode 47 corresponds to the reverse biased right-hand portion of junction $J_3$ in FIGURE 4.

Diode 40 may be an ordinary multiple junction PNPN crystal which exhibits a negative resistance characteristic due to the PN hook collector formed by P-region 41 and N-region 42. The critical breakdown voltage across junction $J_2$ is chosen to be fairly large and corresponds to the breakdown voltage across junction $J_2$ of the diode shown in FIGURE 4. The Zener diode 47 is selected for a low critical breakdown voltage across its junction $J_4$, and this breakdown voltage corresponds to that necessary across the right-hand section of junction $J_3$ in FIGURE 4. The impedance 55 performs the function of the lateral impedance which is built into the base P-region 33 of the diode in FIGURE 4. That is, it is the means for creating a reverse bias potential on junction $J_4$.

In operation, the circuit shown in FIGURE 5 works in a similar fashion as was explained in connection with FIGURE 4. The current flowing across junction $J_2$ of diode 40 divides into two paths 55 and 56. While the back resistance of junction $J_4$ of diode 47 remains high, the current flowing in path 56 remains negligible. Junction $J_3$ of diode 40 is forward biased, but the voltage drop in impedance 55 due to current flowing therethrough creates a reversed bias condition at junction $J_4$ in diode 47 due to the fact that N-regions 44 and 51 are essentially at an equipotential condition. When the reverse breakdown voltage of junction $J_2$ is reached, as indicated at point A on curve 25 of FIGURE 2, the current through impedance 55 is measurably increased. This results in a greater potential drop between P-regions 43 and 50 which results in the breakdown voltage of junction $J_4$ being reached. The breakdown at junction $J_4$ then reduces the resistance of path 56 and allows a large current to flow therethrough. N-region 44 of diode 40 now acts as an emitter for the PN hook collector formed by P-region 41 and N-region 42 of diode 40. The current amplification created by hook action causes the entire electrical circuit to display a negative resistance characteristic, such as exhibited by curve 26 beginning at point B in FIGURE 2, and the voltage across ohmic connections 45 and 48 rapidly reverts to the value of $V_2$.

Figure 7:
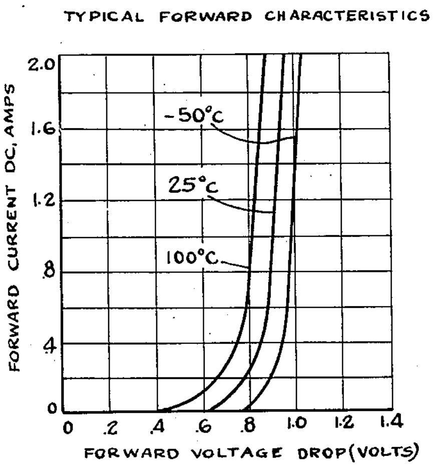
FIGURE 7 is a graph representing a set of characteristic I—V curves for a two-terminal, forward biased, constant potential, breakdown device as utilized in the embodiment of this invention shown in FIGURE 6.

FIGURE 6 shows another embodiment of the electrical circuit of the present invention. This circuit is similar to the one shown in FIGURE 5, with the exception that the polarity of Zener diode 47 is reversed, i.e., the N-region 51 is now connected to resistance 55 while the P-region 50 is connected to the N-region 44 of diode 40. Diode 47 is preferably chosen so as to have a constant voltage portion in its forward direction characteristic, typical operating characteristics of which are shown in FIGURE 7 as disclosed in the Motorola, Inc. publication No. R163 printed in February 1959 and published March 1, 1959, entitled, Diffused Junction Silicon Power Rectifiers. This means that for small positive potentials across junction $J_4$, very little current will flow until a particular magnitude of this positive potential has been reached, whereupon a large current will begin to flow in the forward direction through the diode while the voltage across junction $J_4$ thereafter remains substantially constant. In operation, the circuit of FIGURE 6 performs in a manner similar to that of FIGURE 5. Upon the reverse breakdown of junction $J_2$ in diode 40, the increased current flow through resistance 55 will cause a larger potential drop to be developed between the N and P-regions of diode 47, although very little current will flow therethrough until the magnitude of this potential drop has reached a particular value depending upon the characteristic of diode 47. Upon such a magnitude being reached by a continued increase in current through resistance 55, a large forward current begins to flow through diode 47 which thus allows N-region 44 of diode 40 to now act as an emitter for the PN hook collector formed by P-region 41 and N-region 42. It will be noted that the value of the constant voltage formed across diode 47 will usually be smaller than the reverse breakdown voltage required for this diode. However, the operation of diode 47 in FIGURE 6 is equivalent to its operation in FIGURE 5, since in both cases there is a low current flow through diode 47 until a particular potential has been developed across its junction by virtue of the increased current flow through the resistance 55.

The current $I_2$ at which point B in FIGURE 2 occurs is governed by the following equation:

$I_2R(55)$=forward voltage on $J_3$+voltage on $J_4$ (either reverse breakdown voltage as in FIGURE 5 or constant forward voltage as in FIGURE 6).

For example, a desired $I_2$ current of 1 ma. in FIGURE 5 would require R(55) to be 1000 ohms, if the sum of the above-mentioned voltages across $J_3$ and $J_4$ was 1 volt. A desired $I_2$ current of 100$\mu a$ in FIGURE 6 would require R(55) to be 6000 ohms if the sum of the above-mentioned voltages was 0.6 volt.

What has been described is an electrical circuit having a negative resistance characteristic whose changes in direction and slope may be fully controlled, said circuit comprising two semi-conductor devices in combination with an external impedance so as to utilize the successive voltage breakdown of a rectifying junction contained in each for initiating current amplification by one of said devices.

Various modifications of the structure shown and described may obviously be made without departing from the spirit and scope of the invention, as now expressed in the appended claims.

What is claimed is:

1. An electrical circuit comprising: a first semi-conductor device which can exhibit a negative resistance characteristic having a plurality of regions of alternate conductivity-type semi-conductor material defining rectifying junctions therebetween, a second semi-conductor device of the two-terminal constant potential breakdown type, a relatively low impedance means connecting together a first end region of said first device with a first end region of said second device, a relatively high impedance means connecting together second regions in said first and second devices, said second region in said first device being adjacent to said first end region, a first rectifying junction in said first device which offers a relatively high impedance to a voltage potential thereacross which is less than a magnitude and which breaks down to offer a relatively low impedance when said first magnitude is reached, a first rectifying junction in said second device which offers a relatively high impedance to a voltage potential thereacross which is less than a second magnitude and which breaks down to offer relatively low impedance when said second magnitude is reached, and a pair of terminal means selectively connected to the other end region of said first device and to said second region of said second device which are adapted to receive a variable biasing potential therebetween, with said relatively high impedance means being adjusted so as to cause said first rectifying junction in said first device to breakdown in time prior to the breakdown of said junction in said second device in response to an increase in the value of a biasing potential across said terminals, whereby said circuit exhibits a negative resistance property whose *V/I* characteristic curve is well defined at two switching points so as to cause the current flow through the circuit to be approximately a linear function of the voltage across said circuit.

2. A circuit according to claim 1 in which said first end region of said first device and said first end region of said second device are of like conductivity material.

3. A circuit according to claim 1 in which said first end region of said first device and said first end region of said second device are of opposite conductivity material.

4. A circuit according to claim 1 in which said first device consists of PNPN regions and has three rectifying junctions therein.

5. A circuit according to claim 1 in which said second device consists of PN regions and has one rectifying junction therein.

6. A circuit according to claim 1 in which said first device consists of PNPN regions having three rectifying junctions therebetween, and said second device consists of PN regions having one rectifying junction therebetween.

7. A circuit according to claim 6 in which the end N region of said first device is connected to the N region of said second device by said relatively low impedance means, and the inner P region of said first device is connected to the P region of said second device by said relatively high impedance means.

8. A circuit according to claim 6 in which the end N region of said first device is connected to the P region of said second device by said relatively low impedance means, and the inner P region of said first device is connected to the N region of said second device by said relatively high impedance means.

References Cited in the file of this patent

UNITED STATES PATENTS

| | | |
|---|---|---|
| 2,655,608 | Valdes | Oct. 13, 1953 |
| 2,655,609 | Shockley | Oct. 13, 1953 |
| 2,655,610 | Ebers | Oct. 13, 1953 |
| 2,716,729 | Shockley | Aug. 30, 1955 |
| 2,735,948 | Sziklai | Feb. 21, 1956 |
| 2,876,366 | Hussey | Mar. 3, 1959 |